(12) United States Patent
Tao et al.

(10) Patent No.: US 11,721,674 B2
(45) Date of Patent: Aug. 8, 2023

(54) MICRO-LED ARRAY DEVICE BASED ON III-NITRIDE SEMICONDUCTORS AND METHOD FOR FABRICATING SAME

(71) Applicant: NANJING UNIVERSITY, Nanjing (CN)

(72) Inventors: Tao Tao, Nanjing (CN); Xuan Wang, Nanjing (CN); Feifan Xu, Nanjing (CN); Bin Liu, Nanjing (CN); Ting Zhi, Nanjing (CN); Rong Zhang, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 121 days.

(21) Appl. No.: 17/103,986

(22) Filed: Nov. 25, 2020

(65) Prior Publication Data

US 2021/0193632 A1    Jun. 24, 2021

(30) Foreign Application Priority Data

Dec. 23, 2019   (CN) .......................... 201911334325.2

(51) Int. Cl.
| | |
|---|---|
| *H01L 33/00* | (2010.01) |
| *H01L 25/075* | (2006.01) |
| *H01L 33/06* | (2010.01) |
| *H01L 33/24* | (2010.01) |
| *H01L 33/32* | (2010.01) |
| *H01L 33/40* | (2010.01) |

(52) U.S. Cl.
CPC ...... *H01L 25/0753* (2013.01); *H01L 33/0025* (2013.01); *H01L 33/0075* (2013.01); *H01L 33/06* (2013.01); *H01L 33/24* (2013.01); *H01L 33/32* (2013.01); *H01L 33/40* (2013.01)

(58) Field of Classification Search
CPC .......................... H01L 33/0025; H01L 33/32
See application file for complete search history.

(56) References Cited

U.S. PATENT DOCUMENTS

| 10,923,630 B1* | 2/2021 | Pynn ....................... H01L 33/16 |
| 2009/0273010 A1* | 11/2009 | Simoen ............... H01L 21/3228 |
| | | 257/E21.317 |
| 2012/0223875 A1* | 9/2012 | Lau ........................ H05B 45/44 |
| | | 345/82 |
| 2013/0146932 A1* | 6/2013 | McDaniel, Jr. ......... H01L 33/38 |
| | | 257/99 |

FOREIGN PATENT DOCUMENTS

CN    109935614 A    6/2019

\* cited by examiner

*Primary Examiner* — Moazzam Hossain
*Assistant Examiner* — Hajar Kolahdouzan
(74) *Attorney, Agent, or Firm* — Bayramoglu Law Offices, LLC

(57) ABSTRACT

A Micro-LED array device based on III-nitride semiconductors and a method for fabricating the same are provided. The Micro-LED array device includes arrayed sector mesa structures that are formed by etching to penetrate through a p-type GaN layer and a quantum-well active layer and deep into an n-type GaN layer, a p-type electrode array deposited by evaporation on the p-type GaN layer of sector arrays, and an n-type electrode array deposited by evaporation on the n-type GaN layer. The n-type electrode array forms blocking walls to isolate the sector mesas from one another. The blocking walls, and each of the blocking walls and the annular structure surrounding the sector mesa are connected to each other.

14 Claims, 10 Drawing Sheets

MICRO-LED ARRAY DEVICE BASED ON III-NITRIDE SEMICONDUCTORS AND METHOD FOR FABRICATING SAME

CROSS REFERENCE TO THE RELATED APPLICATIONS

This application is based upon and claims priority to Chinese Patent Application No. 201911334325.2, filed on Dec. 23, 2019, the entire contents of which are incorporated herein by reference.

TECHNICAL FIELD

The present disclosure relates to a Micro-LED array device based on III-nitride semiconductors and a method for fabricating the same. The present disclosure also belongs to the technical field of semiconductor lighting and display.

BACKGROUND

III-Nitride materials are direct band gap semiconductors and have band gaps spanning a wide spectrum, ranging from deep ultraviolet to near infrared. They are widely used in high-efficiency solid-state lighting and ultrahigh resolution display. Unlike the traditional lighting, semiconductor lighting is a revolutionary technique, which uses a semiconductor chip as a luminous source to directly convert electric energy into optical energy with relatively high conversion efficiency. A light emitting diode (LED), as a core component of a semiconductor light source for solid-state lighting, has the advantages of high brightness, long service life, small size, low energy consumption, environmental friendliness, safety in use, etc., and is highly stable and capable of operating in severe environments. Thus, LED is a new generation lighting source after incandescent lamps and fluorescent lamps. With the continuous development of LED, the solid-state lighting technique has gradually replaced the existing lighting techniques, leading us into a new era of lighting.

Micro-LEDs usually refer to an LED having a size of 1-100 µm. This allows for miniaturization of an LED device by integrating high-density micro-sized LED arrays on a chip based on pixelation and matricization techniques. Due to unique small size characteristics, Micro-LEDs have higher quantum efficiency and better heat dissipation capability, and even much higher current saturation density and higher modulation bandwidth than large-sized LEDs. Therefore, Micro-LEDs have been extensively used in various fields, including micro-displays, visible light communications, and emitter arrays and optical tweezer systems of optogenetics.

A common size of a gallium nitride-based Micro-LED is several tens of microns, so that a large number of Micro-LED arrays can be integrated within a relatively small area. However, due to the small area, the space between light emitting units is small, resulting in easy mutual interference therebetween. When one Micro-LED is lit up, the light emitting units around it may be influenced. Especially in a Micro-LED array on a sapphire substrate, when one Micro-LED is lit up, a bright area around it may be observed on a macroscopic level due to excellent light transmittance of the sapphire, which hinders the pixelation application in display field. The present disclosure solves the problem of mutual interference between light emitting units by using special blocking walls during the fabrication of Micro-LEDs.

Chinese patent document No. CN109935614A discloses a micron full-color quantum dot light emitting diode (QLED) array device based on a quantum dot transfer process with a deep silicon etching mask and a method for fabricating the same. Arrays are separated by isolation trenches filled with a light-absorbing material, such as silver. The isolation trenches are formed by an inductively coupled plasma (ICP) etching method for isolation, which are mainly aimed at electrical isolation to prevent mutual effects of electrical properties of adjacent devices. Such isolation trenches, however, cannot block propagating light, and therefore, there still exists the problem of optical mutual interference between adjacent pixel cells. The filling of silver is to enhance the quantum efficiency of the LED device, which, however, cannot solve the problem of optical mutual interference and cannot serve as an electrode.

SUMMARY

The present disclosure aims to provide a Micro-LED array device to address the problem of mutual interference between light emitting units of Micro-LEDs.

The present disclosure adopts the following technical solutions: a Micro-LED array device based on III-nitride semiconductors structurally includes, from top to bottom, in sequence:

a Si substrate;
a GaN buffer layer grown on the Si substrate;
an n-type GaN layer grown on the buffer layer;
an InGaN/GaN quantum-well active layer grown on the n-type GaN layer; and
a p-type GaN layer grown on the quantum-well active layer.

The Micro-LED array device has n arrayed sector mesa units. In each unit, a sector mesa structure is formed by etching to penetrate through the p-type GaN layer and the quantum-well active layer and deep into the n-type GaN layer. The Micro-LED array device further includes a p-type electrode array deposited by evaporation on the p-type GaN layer of sector arrays, and an n-type electrode array deposited by evaporation on the n-type GaN layer. The n-type electrodes in each unit surround the sector mesa in the form of an annular structure, and the n-type electrode array forms blocking walls to isolate the sector mesas from one another. The blocking walls, and the blocking wall and the annular structure surrounding the sector mesa are connected to each other.

Preferably, the Si substrate has a thickness of 800 µm. The GaN buffer layer has a thickness of 1750 nm. The n-type GaN layer has a thickness of 1650-1850 nm. The InGaN/GaN quantum-well active layer has a thickness of 200-300 nm, a period number of 10, an In content of 0.26, a Ga content of 0.74, a well width of 2.2 nm, and a barrier thickness of 5.8 nm. The p-type GaN layer has a thickness of 100-200 nm.

Preferably, the arrayed sector mesa may come in three sizes: from the inside out, a mesa defined by one quarter of a circular ring with a radius of 32 µm; a mesa defined by one eighth of a circular ring and one quarter of a circular ring inside with a difference of 50 µm between inside and outside radii; and a mesa defined by one eighth of a circular ring and one eighth of a circular ring inside with a difference of 100 µm between inside and outside radii. The sector mesas in three sizes may be concentric, and a period between the outermost circular ring sector and a next circular ring sector in the same size may be 900 µm. With the sector mesas in three different sizes within one concentric circle, the effects of the size factor on luminous intensity and mutual interference can be compared within a small range without changing the parameters of the blocking wall.

The present disclosure further discloses a method for fabricating the Micro-LED array device, including the following steps:

(1) depositing an insulating layer as a first dielectric layer on an InGaN/GaN quantum-well LED epitaxial wafer using plasma enhanced chemical vapor deposition (PECVD) technique;

(2) coating the first dielectric layer with photoresist by spinning, prebaking the photoresist, using ultra-violet lithography with a mask to form ordered sector mesa array patterns on the photoresist, and carrying out developing and postbaking;

(3) using reactive ion etching (ME) technique, introducing $O_2$ to remove a small amount of residual photoresist in regions where most of the photoresist is removed by developing;

(4) depositing by evaporation a metal mask layer using physical vapor deposition (PVD) technique, and removing the photoresist layer and a metal film layer on the photoresist layer using a lift-off technique, to obtain ordered sector mesa array patterns with a large area;

(5) using the ME technique, longitudinally etching the first dielectric layer with metal as a mask to transfer the sector mesa array structures to the p-type GaN layer;

(6) using inductively coupled plasma (ICP) technique, anisotropically etching the p-type GaN layer and the quantum-well layer to the n-type GaN layer with metal as a mask;

(7) using wet etching, removing the metal mask layer and the first dielectric layer from the sector mesa array structures, thereby forming GaN sector mesa array structures isolated from one another, and repairing etching damage in sidewalls of the GaN layer and the quantum-well layer;

(8) fabricating the n-type electrode array structure that isolates the sector mesa arrays from one another: firstly depositing by evaporation an insulating layer as a second dielectric layer on the GaN sector mesa array structures using the PECVD technique and coating the second dielectric layer with the photoresist by spinning; forming n-type electrode array structure patterns by overlaying on the photoresist of the sector mesa array structures using the ultra-violet lithography with a mask having the n-type electrode array structure, and etching the second dielectric layer using the ME technique with the photoresist as a mask to transfer the n-type electrode array structure patterns to the n-type GaN layer;

(9) fabricating the n-type electrodes: depositing by evaporation a metal in the regions of the n-type electrode array structure patterns as the n-type electrodes using the PVD technique, then carrying out a lift-off process to remove the photoresist layer and the metal film covering the photoresist layer, washing and drying samples, and finally realizing ohmic contact between the metal and the n-type GaN layer using a thermal annealing technique; and

(10) fabricating the p-type electrodes: carrying out a spin coating to obtain a new layer of photoresist, forming p-type electrode array patterns by overlaying on the photoresist using the ultra-violet lithography with a mask, and etching the second dielectric layer using the RIE technique with the photoresist as a mask to transfer the p-type electrode array patterns to the p-type GaN layer; depositing by evaporation a layer of metal as the p-type electrode array using the PVD technique, then carrying out the lift-off process to remove the photoresist layer and the metal film covering the photoresist layer, washing and drying samples, and finally realizing ohmic contact between the metal and the p-type GaN layer using the thermal annealing technique.

Preferably, the blocking wall formed by the n-type electrodes is 6-10 μm wide and 450-550 nm thick.

Preferably, the first dielectric layer and the second dielectric layer each has a thickness of 150-250 nm, and is made of $SiO_2$, and the metal mask layer is 50 nm thick, and made of nickel (Ni).

Preferably, the n-type electrode array is composed of a plurality of layers of metals titanium (Ti)/aluminum (Al)/nickel (Ni)/gold (Au) having a thickness of 450-500 nm, and the p-type electrode array is composed of a plurality of layers of metals Ni/Au having a thickness of 150-200 nm.

The present disclosure, aiming at the problem of optical mutual interference, particularly adds blocking walls formed by n-type electrodes between light emitting units of Micro-LED sector mesa arrays, which can serve not only for electrical isolation to physically isolate optical propagating paths, but also for optical isolation to effectively solve the problem of mutual interference between the light emitting units of Micro-LEDs and facilitate individual control without obviously increasing the size of Micro-LED arrays. With the n-type electrode metal as the blocking walls and the p-type electrodes of grid structures, the current expanding range can be increased, so that the luminous efficiency is effectively improved. Thus, applications in many fields such as ultrahigh resolution lighting and display, communication, and biosensing are allowed.

Figure 1:
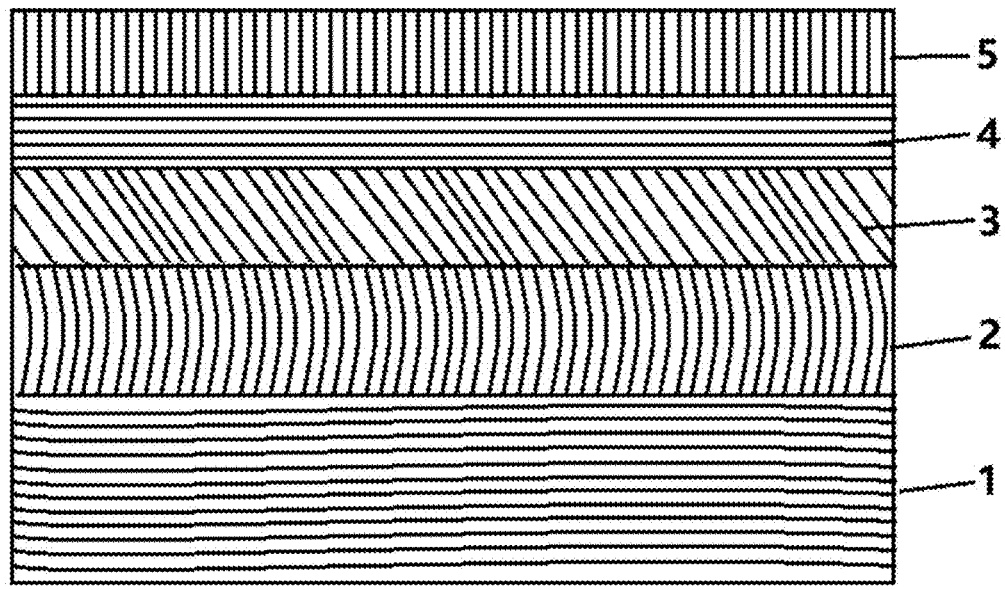
FIG. 1 is a structural schematic diagram of an InGaN/GaN quantum-well LED substrate grown by metal organic chemical vapor deposition (MOCVD) method.

The specific embodiments of the present disclosure will be further described with reference to the accompanying drawings.

DETAILED DESCRIPTION OF THE EMBODIMENTS

The technical solutions in embodiments of the present disclosure will be described clearly and completely with reference to the accompanying drawings in examples of the present disclosure. Apparently, the described embodiments are merely a part rather than all of the embodiments of the present disclosure. All other embodiments derived by a person of ordinary skill in the art from the embodiments of the present disclosure without creative efforts shall fall within the protection scope of the present disclosure.

Embodiment 1

A method for fabricating a Micro-LED array device based on III-nitride semiconductors with addition of blocking walls included the following steps.

The method was carried out on a Si blue LED epitaxial wafer that was structurally composed of:

the Si substrate 1 having a thickness of 800 μm;

the GaN buffer layer 2 grown on the Si substrate and having a thickness of 1750 nm;

the n-type GaN layer 3 grown on the buffer layer and having a thickness of 1650 nm;

the InGaN/GaN quantum-well active layer 4 grown on the n-type GaN layer;

wherein the InGaN/GaN quantum-well active layer has a thickness of 200 nm, a period number of 10, an In content of 0.26, a Ga content of 0.74, a well width of 2.2 nm, and a barrier thickness of 5.8 nm; and the p-type GaN layer 5 grown on the quantum-well active layer and having a thickness of 100 nm.

Figure 2:
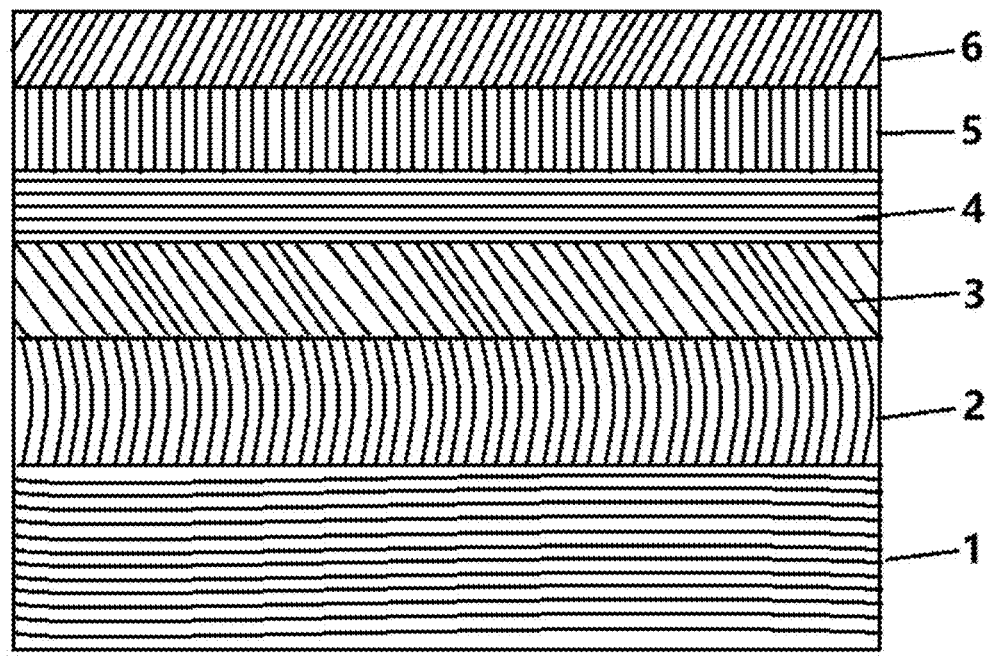
FIG. 2 is a structural schematic diagram of a resulting Micro-LED array device from step (1) according to the present disclosure.

(1) The first dielectric layer 6 was deposited by evaporation a $SiO_2$ layer having a thickness of 150 nm on the Si blue LED epitaxial wafer using plasma enhanced chemical vapor deposition (PECVD) technique, as shown in FIG. 2, and a gas mixture of 5% $SiH_4/N_2$ and $N_2O$ was introduced for 7 minutes and 10 seconds, with respective flow rate of 100 sccm and 450 sccm, a pressure of 300 mTorr, a power of 10 W, and a temperature of 350° C.

Figure 3:
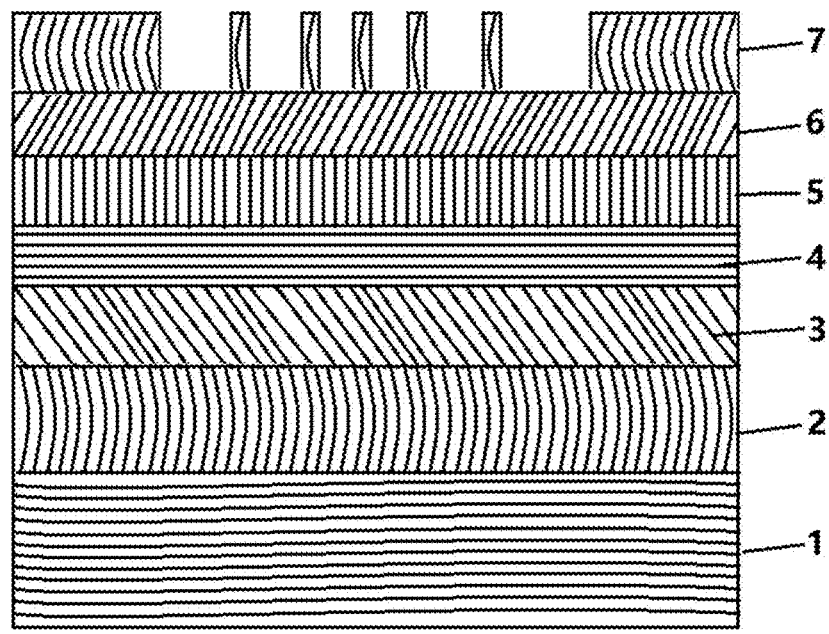
FIG. 3 is a structural schematic diagram of a resulting Micro-LED array device from step (2) according to the present disclosure.
Figure 11:
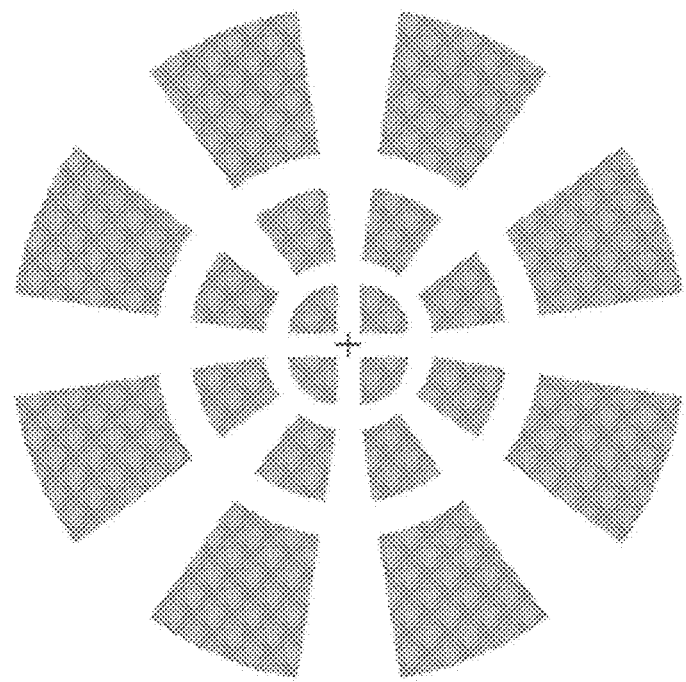
FIG. 11 is a schematic diagram of a mask used in step (2) according to the present disclosure.

(2) The insulating $SiO_2$ dielectric layer 6 was coated with the photoresist (S1805) layer 7 by spinning and then subjected to prebaking at 100° C. for 1 minute. Then, ordered sector mesa array patterns were formed on the photoresist using ultra-violet lithography with the mask as shown in FIG. 11, and exposed for 1 second, developed for 11 seconds and postbaked at 100° C. for 1 minute, as shown in FIG. 3.

Figure 4:
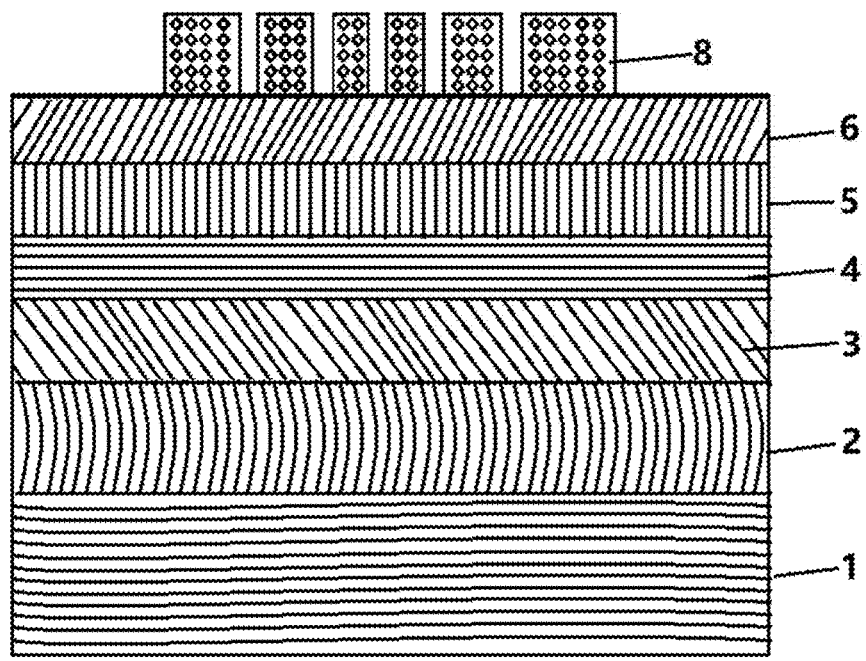
FIG. 4 is a structural schematic diagram of a resulting Micro-LED array device from step (4) according to the present disclosure.

(3) Using reactive ion etching (ME) technique, $O_2$ was introduced for 20 seconds with a flow rate of 10 sccm, a pressure of 3 Pa and a power of 50 W to remove residual photoresist, and a 50 nm thick layer of metal nickel (Ni) was deposited by evaporation as the metal mask layer 8 using physical vapor deposition (PVD) technique at a rate of 1 A/s. Next, a lift-off process was carried out using an acetone solution under ultrasound for 5 minutes to remove the photoresist layer 7 and the metal Ni film layer 8 on the photoresist layer, to obtain ordered metal sector mesa array patterns with a large area, as shown in FIG. 4.

Figure 5:
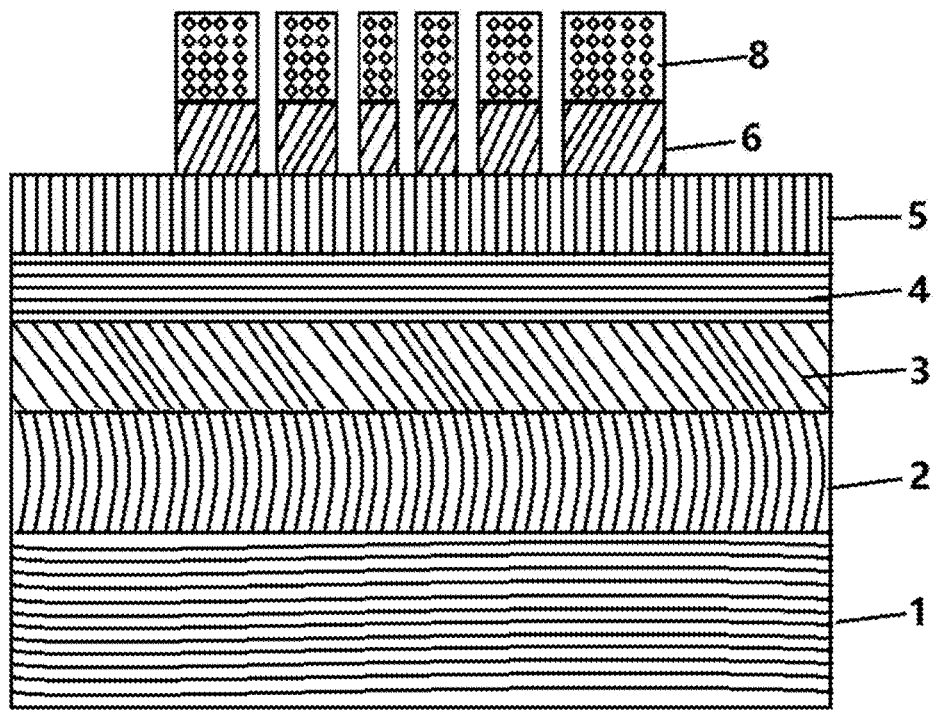
FIG. 5 is a structural schematic diagram of a resulting Micro-LED array device from step (5) according to the present disclosure.

(4) Using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the first $SiO_2$ dielectric layer 6 was longitudinally etched with the metal Ni as a mask layer to transfer the metal sector mesa structures to the p-type GaN layer, as shown in FIG. 5.

Figure 6:
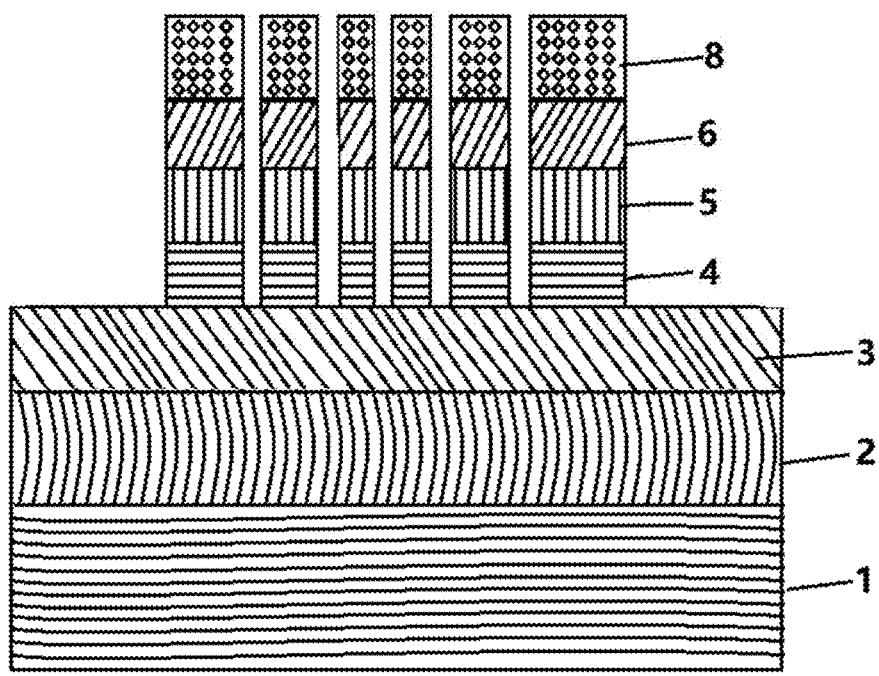
FIG. 6 is a structural schematic diagram of a resulting Micro-LED array device from step (6) according to the present disclosure.

(5) Using inductively coupled plasma (ICP) technique, a gas mixture of $Cl_2$ and $BCl_3$ was introduced for 3 minutes and 30 seconds, with respective flow rate of 48 sccm and 6 sccm, an ICP power of 300 W, an RF power of 100 W, and a pressure of 10 mTorr, and the p-type GaN layer 5 and the quantum-well layer 4 were anisotropically etched with the metal Ni as a mask to form sector mesa array structures deep into the n-type GaN layer 3, as shown in FIG. 6, with an etching depth of about 800 nm.

Figure 7:
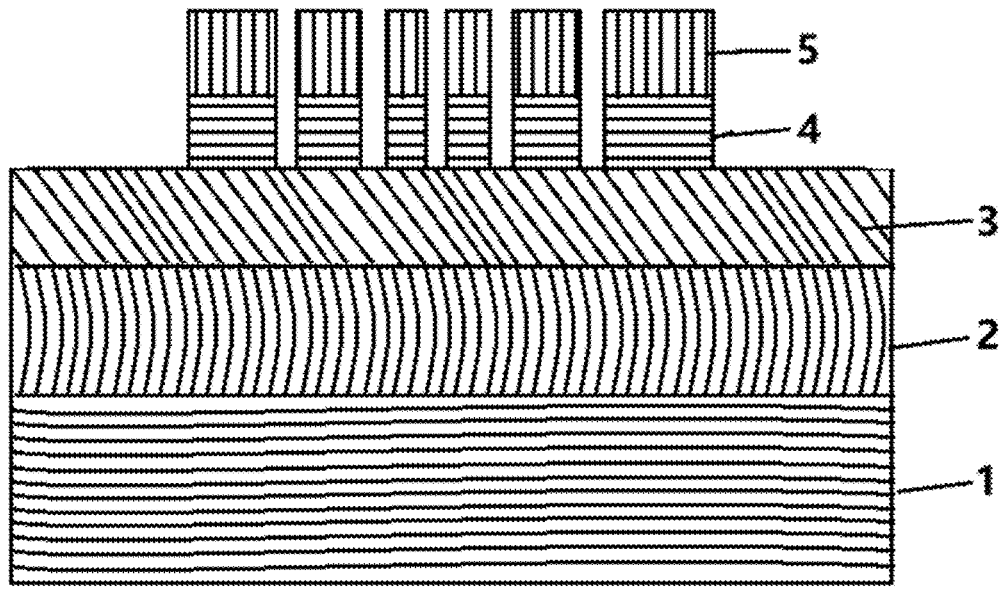
FIG. 7 is a structural schematic diagram of a resulting Micro-LED array device from step (7) according to the present disclosure.

(6) Using wet etching, samples were firstly put in a KOH solution at a concentration of 0.5 mol/L, and heated in a water bath at 40° C. for 15 minutes to repair etching damage in sidewalls of GaN and quantum wells. Next, the samples were soaked in a nitric acid solution at a concentration of nitric acid:water=1:5 at room temperature for 10 minutes to remove the metal mask layer 8, and soaked in a buffered oxide etch (BOE) for 1 minute to remove the first $SiO_2$ dielectric layer 6, thereby forming GaN sector mesa array structures isolated from one another, as shown in FIG. 7.

Figure 8:
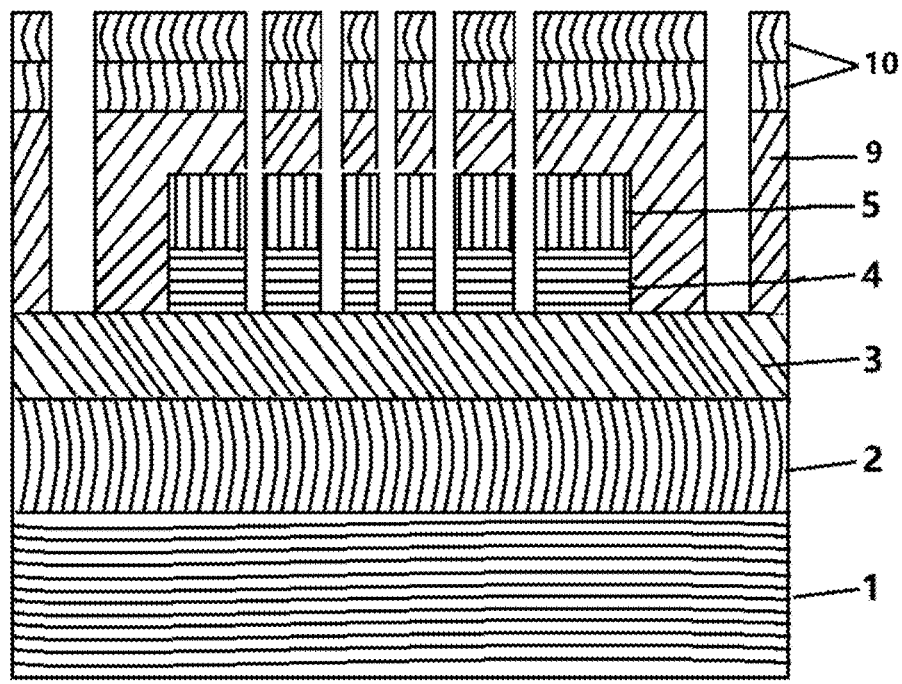
FIG. 8 is a structural schematic diagram of a resulting Micro-LED array device from step (8) according to the present disclosure.
Figure 12:
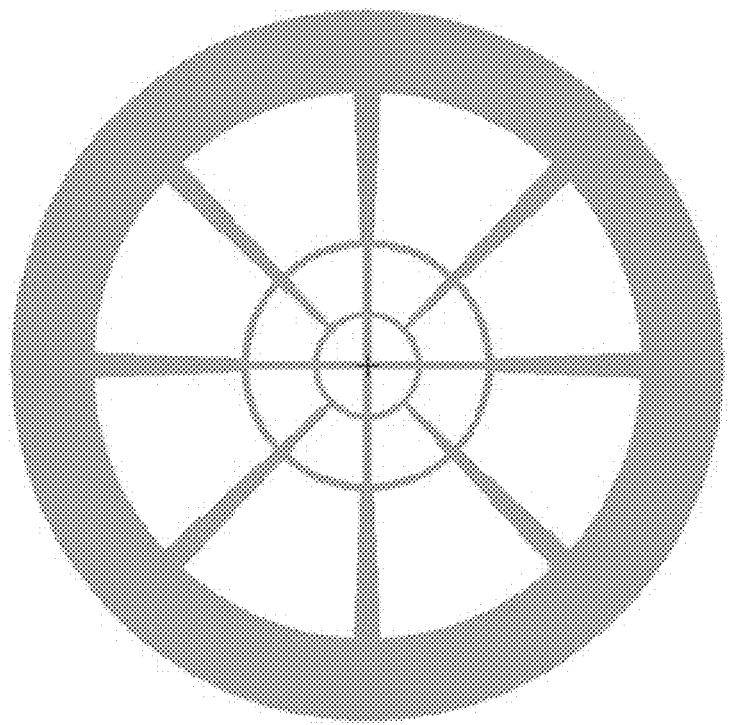
FIG. 12 is a schematic diagram of a mask used in step (8) according to the present disclosure.

(7) The second $SiO_2$ dielectric layer 9 having a thickness of 150 nm was deposited by evaporation using the PECVD technique, and a gas mixture of 5% $SiH_4/N_2$ and $N_2O$ was introduced for 7 minutes and 10 seconds, with respective flow rate of 100 sccm and 450 sccm, a pressure of 300 mTorr, a power of 10 W, and a temperature of 350° C. Next, spin coating was performed to obtain two layers of photoresist 10, the first layer of photoresist (LOR10B) was prebaked at 150° C. for 5 minutes, and the second layer of photoresist (AZ1500) was prebaked at 90° C. for 2 minutes. Then, blocking wall patterns and n-type electrode patterns were formed by overlaying on the photoresist using the ultra-violet lithography with the mask as shown in FIG. 12, with an exposure time of 4.3 seconds, a developing time of 9 seconds and postbaking at 100° C. for 1 minute. Using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the second $SiO_2$ dielectric layer 9 was etched with the photoresist as a mask to transfer the blocking wall patterns and the n-type electrode patterns to the n-type GaN layer, as shown in FIG. 8.

Figure 9:
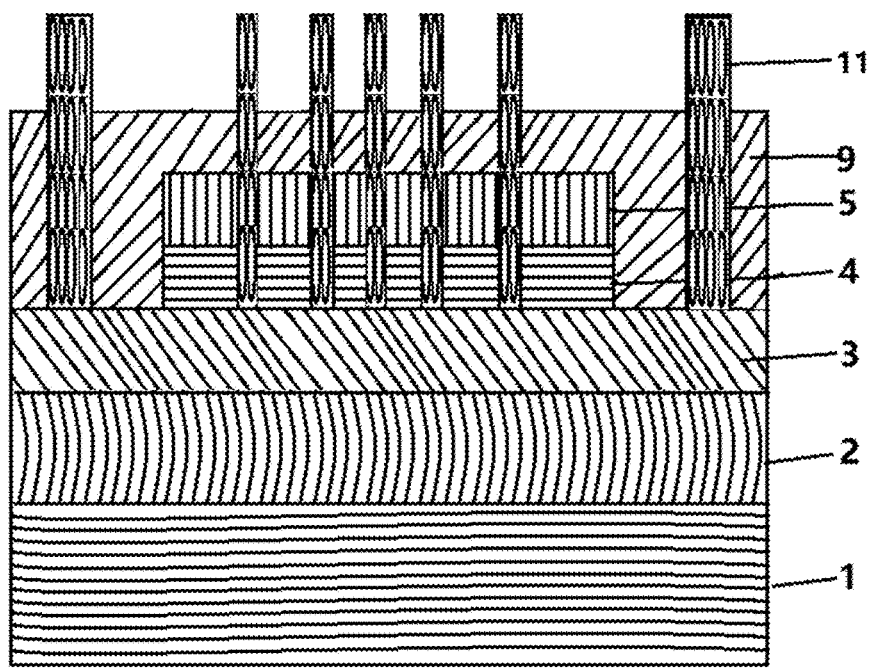
FIG. 9 is a structural schematic diagram of a resulting Micro-LED array device from step (9) according to the present disclosure.

(8) Fabrication of n-type electrodes: metals titanium (Ti)/aluminum (Al)/nickel (Ni)/gold (Au) were deposited by evaporation in the regions of the blocking walls and the regions of the n-type electrode patterns using the PVD technique with respective thicknesses of 20 nm/200 nm/50 nm/180 nm, a total thickness of 450 nm, as the n-type electrode 11, where the blocking wall was 6 μm wide and 450 nm thick. Then, a lift-off process was carried out using an acetone solution under ultrasound for 5 minutes to remove the photoresist layer 10 and the n-type electrode metal layer on the photoresist layer. Samples were washed and dried. Finally, ohmic contact between the metals Ti/Al/Ni/Au and the n-type GaN layer was realized using a thermal annealing technique under conditions of $N_2$, a temperature of 750° C. and time of 30 seconds, as shown in FIG. 9.

Figure 10:
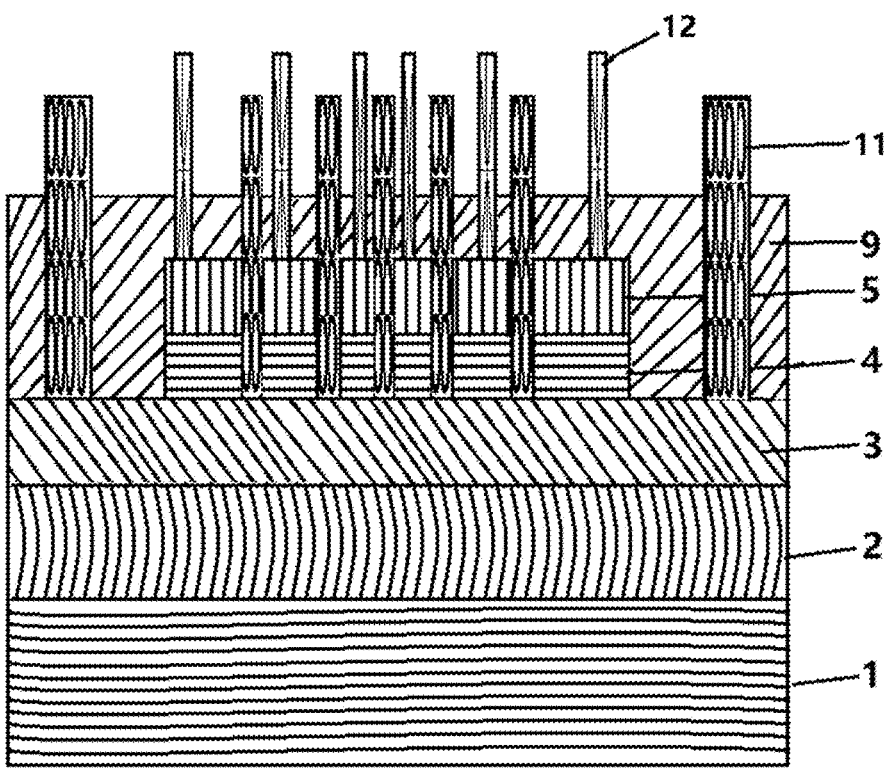
FIG. 10 is a structural schematic diagram of a resulting Micro-LED array device from step (10) according to the present disclosure.
Figure 13:
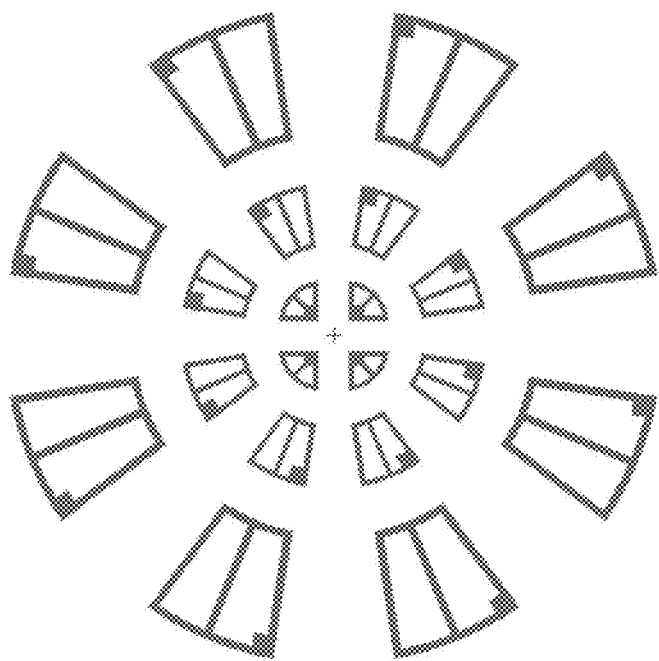
FIG. 13 is a schematic diagram of a mask used in step (10) according to the present disclosure.

(9) Fabrication of p-type electrodes: spin coating was performed to obtain two new layers of photoresist, the first layer of photoresist (LOR10B) was prebaked at 150° C. for 5 minutes, and the second layer of photoresist (AZ1500) was prebaked at 90° C. for 2 minutes. Then, p-type electrode patterns were formed by overlaying on the photoresist using the ultra-violet lithography with the mask as shown in FIG. 13, with an exposure time of 4.3 seconds and a developing time of 9 seconds. Then, using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the second $SiO_2$ dielectric layer 9 was etched with the photoresist as a mask to transfer the p-type electrode patterns to the p-type GaN layer 5. Metals Ni/Au were deposited by evaporation using the PVD technique with respective thickness of 30 nm/120 nm, a total thickness of 150 nm, as the p-type electrode 12. Then, the photoresist layer and the metal Ni/Au film layer on the photoresist layer were removed using an acetone solution under ultrasound for 5 minutes. Samples were washed and dried. Finally, ohmic contact between the metals Ni/Au and the p-type GaN layer was realized using the thermal annealing technique under conditions of $O_2$ and $N_2$ in a ratio of 1:4, a temperature of 500° C. and time of 10 minutes, as shown in FIG. 10.

Figure 14:
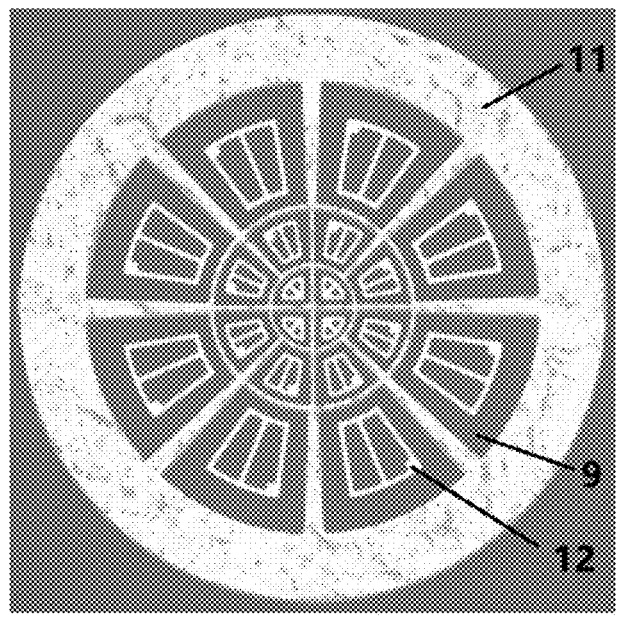
FIG. 14 is an optical micrograph of a Micro-LED array device fabricated according to the present disclosure, in which the outermost white circular ring is an annular n-type electrode, line-like structures in white linked with the circular ring are blocking walls formed by n-type electrodes, and white grid structures in sectors are p-type electrodes.
Figure 15:
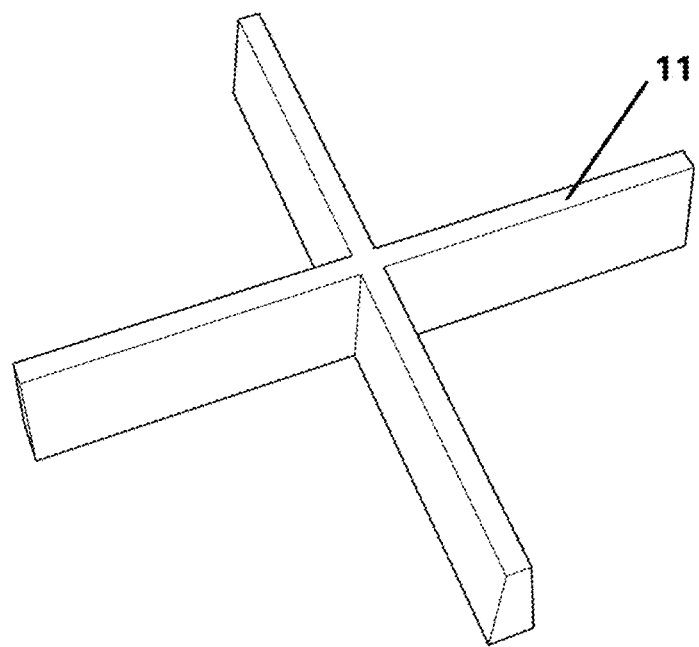
FIG. 15 shows part of blocking walls formed by n-type electrodes in a Micro-LED array device fabricated according to the present disclosure.
Figure 16:
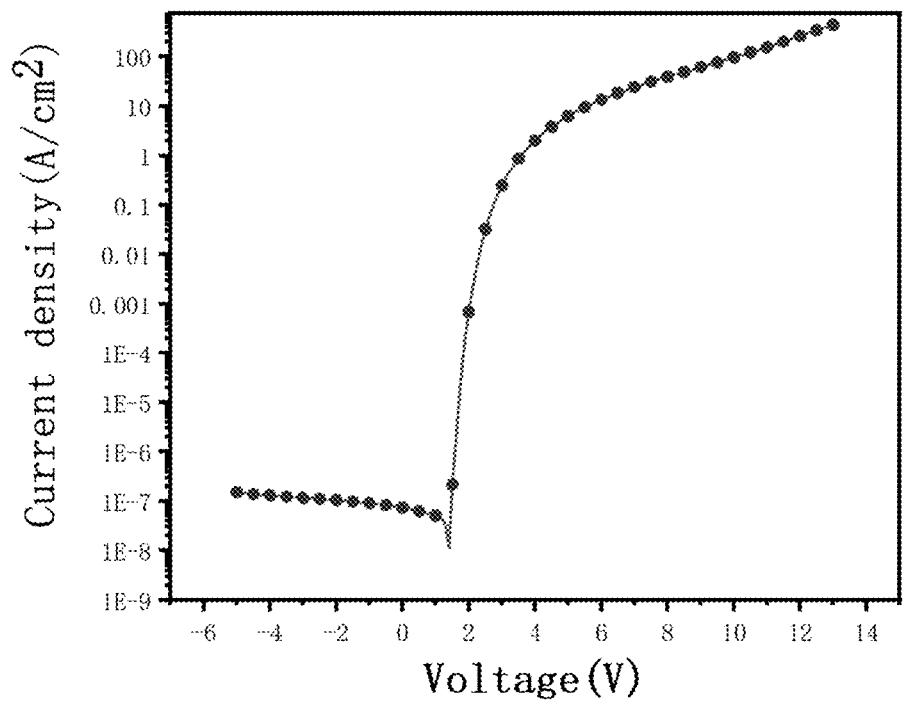
FIG. 16 is an I-V curve graph of a Micro-LED array device fabricated according to the present disclosure.
Figure 17:
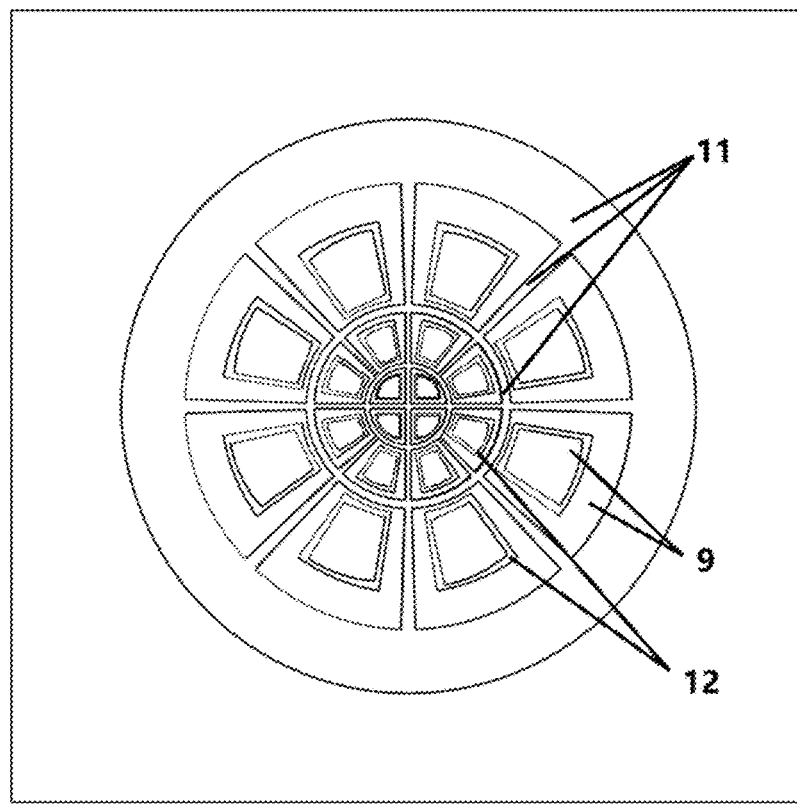
FIG. 17 is a planar structural schematic diagram of a Micro-LED array device fabricated according to the present disclosure.
Figure 18:
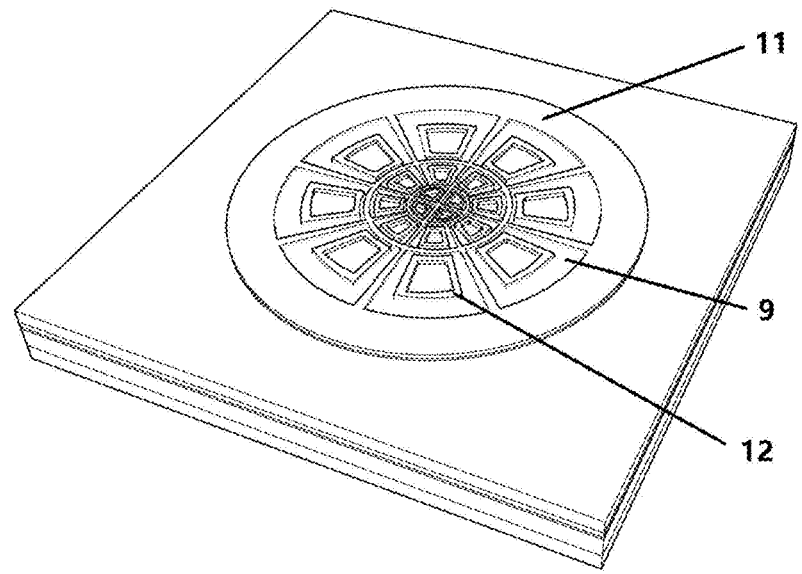
FIG. 18 is a three-dimensional structural schematic diagram of a Micro-LED array device fabricated according to the present disclosure.
Figure 19:
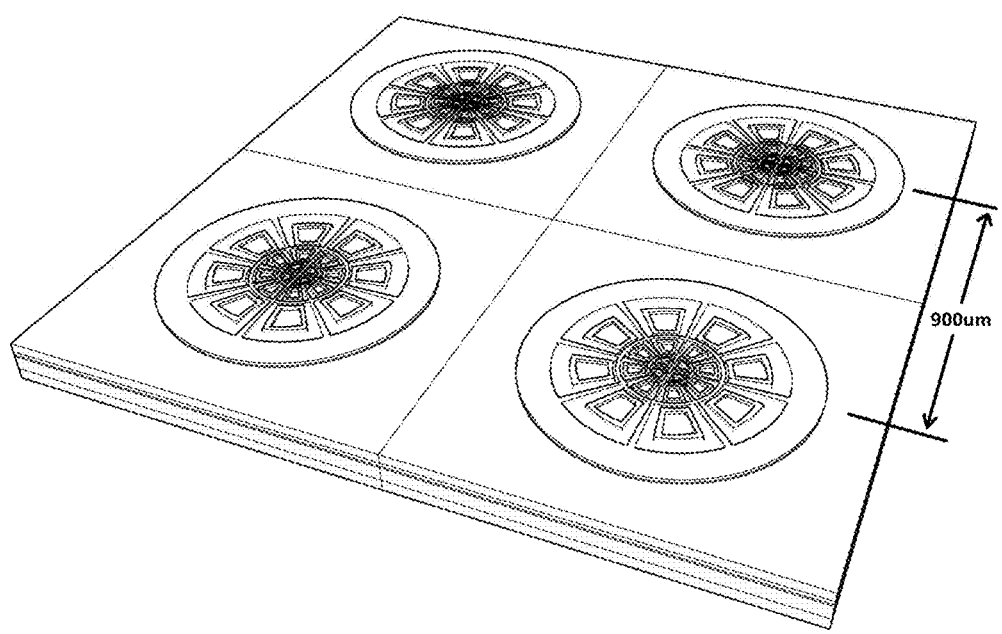
FIG. 19 is a three-dimensional structural schematic diagram showing arrays of a Micro-LED array device fabricated according to the present disclosure.

(10) A top view of the resulting Micro-LED array device under an optical microscope was as shown in FIG. 14, an electrical test I-V characteristic curve was shown in FIG. 16, a planar structural schematic diagram was shown in FIG. 17, and a three-dimensional structural schematic diagram was shown in FIG. 18.

Embodiment 2

A method for fabricating a Micro-LED array device based on III-Nitride semiconductors with addition of blocking walls included the following steps.

The method was carried out on a Si blue LED epitaxial wafer that was structurally composed of:
the Si substrate 1 having a thickness of 800 μm;
the GaN buffer layer 2 grown on the Si substrate and having a thickness of 1750 nm;
the n-type GaN layer 3 grown on the buffer layer and having a thickness of 1750 nm;
the InGaN/GaN quantum-well active layer 4 grown on the n-type GaN layer; wherein the InGaN/GaN quantum-well active layer has a thickness of 250 nm, a period number of 10, an In content of 0.26, a Ga content of 0.74, a well width of 2.2 nm, and a barrier thickness of 5.8 nm; and
the p-type GaN layer 5 grown on the quantum-well active layer and having a thickness of 150 nm.

(1) The first dielectric layer 6 was deposited by evaporation a $SiO_2$ layer having a layer of 200 nm on the Si blue LED epitaxial wafer using plasma enhanced chemical vapor deposition (PECVD) technique, as shown in FIG. 2, and a gas mixture of 5% $SiH_4/N_2$ and $N_2O$ was introduced for 9 minutes and 40 seconds, with respective flow rate of 100 sccm and 450 sccm, a pressure of 300 mTorr, a power of 10 W, and a temperature of 350° C.

(2) The insulating $SiO_2$ dielectric layer 6 was coated with the photoresist (S1805) layer 7 by spinning and then subjected to prebaking at 100° C. for 1 minute. Then, ordered sector mesa array patterns were formed on the photoresist using ultra-violet lithography with the mask as shown in FIG. 11, and exposed for 1 second, developed for 10 seconds and postbaked at 100° C. for 1 minute, as shown in FIG. 3.

(3) Using reactive ion etching (ME) technique, $O_2$ was introduced for 20 seconds with a flow rate of 10 sccm, a pressure of 3 Pa and a power of 50 W to remove residual photoresist, and a 50 nm thick layer of metal nickel (Ni) was deposited by evaporation as the metal mask layer 8 using physical vapor deposition (PVD) technique at a rate of 1 A/s. Next, a lift-off process was carried out using an acetone solution under ultrasound for 5 minutes to remove the photoresist layer 7 and the metal Ni film layer 8 on the photoresist layer, to obtain ordered metal sector mesa array patterns with a large area, as shown in FIG. 4.

(4) Using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the first $SiO_2$ dielectric layer 6 was longitudinally etched with the metal Ni as a mask layer to transfer the metal sector mesa structures to the p-type GaN layer, as shown in FIG. 5.

(5) Using inductively coupled plasma (ICP) technique, a gas mixture of $Cl_2$ and $BCl_3$ was introduced for 3 minutes and 30 seconds, with respective flow rate of 48 sccm and 6 sccm, an ICP power of 300 W, an RF power of 100 W, and a pressure of 10 mTorr, and the p-type GaN layer 5 and the quantum-well layer 4 were anisotropically etched with the metal Ni as a mask to form sector mesa array structures deep into the n-type GaN layer 3, as shown in FIG. 6, with an etching depth of about 800 nm.

(6) Using wet etching, samples were firstly put in a KOH solution at a concentration of 0.5 mol/L, and heated in a water bath at 40° C. for 15 minutes to repair etching damage in sidewalls of GaN and quantum wells. Next, the samples were soaked in a nitric acid solution at a concentration of nitric acid:water=1:5 at room temperature for 10 minutes to remove the metal mask layer 8, and soaked in a buffered oxide etch (BOE) for 1 minute to remove the first $SiO_2$ dielectric layer 6, thereby forming GaN sector mesa array structures isolated from one another, as shown in FIG. 7.

(7) The second $SiO_2$ dielectric layer 9 having a thickness of 200 nm was deposited by evaporation using the PECVD technique, and a gas mixture of 5% $SiH_4/N_2$ and $N_2O$ was introduced for 9 minutes and 40 seconds, with respective flow rate of 100 sccm and 450 sccm, a pressure of 300 mTorr, a power of 10 W, and a temperature of 350° C. Next, spin coating was performed to obtain two layers of photoresist 10, the first layer of photoresist (LOR10B) was prebaked at 150° C. for 5 minutes, and the second layer of photoresist (AZ1500) was prebaked at 90° C. for 2 minutes. Then, blocking wall patterns and n-type electrode patterns were formed by overlaying on the photoresist using the ultra-violet lithography with the mask as shown in FIG. 12, with an exposure time of 4.3 seconds, developing time of 9 seconds and postbaking at 100° C. for 1 minute. Using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the second $SiO_2$ dielectric layer 9 was etched with the photoresist as a mask to transfer the blocking wall patterns and the n-type electrode patterns to the n-type GaN layer, as shown in FIG. 8.

(8) Fabrication of n-type electrodes: metals titanium (Ti)/aluminum (Al)/nickel (Ni)/gold (Au) were deposited by evaporation in the regions of the blocking walls and the regions of the n-type electrode patterns using the PVD technique with respective thickness of 30 nm/210 nm/50 nm/210 nm, a total thickness of 500 nm, as the n-type electrode 11, where the blocking wall was 8 µm wide and 500 nm thick. Then, a lift-off process was carried out using an acetone solution under ultrasound for 5 minutes to remove the photoresist layer 10 and the n-type electrode metal layer on the photoresist layer. Samples were washed and dried. Finally, ohmic contact between the metals Ti/Al/Ni/Au and the n-type GaN layer was realized using a thermal annealing technique under conditions of $N_2$, a temperature of 750° C. and time of 30 seconds, as shown in FIG. 9.

(9) Fabrication of p-type electrodes: spin coating was performed to obtain two new layers of photoresist, the first layer of photoresist (LOR10B) was prebaked at 150° C. for 5 minutes, and the second layer of photoresist (AZ1500) was prebaked at 90° C. for 2 minutes. Then, p-type electrode patterns were formed by overlaying on the photoresist using the ultra-violet lithography with the mask as shown in FIG. 13, with an exposure time of 4.3 seconds and developing time of 9 seconds. Then, using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the second $SiO_2$ dielectric layer 9 was etched with the photoresist as a mask to transfer the p-type electrode patterns to the p-type GaN layer 5. Metals Ni/Au were deposited by evaporation using the PVD technique with respective thickness of 30 nm/150 nm, a total thickness of 180 nm, as the p-type electrode 12. Then, the photoresist layer and the metal Ni/Au film layer on the photoresist layer were removed using an acetone solution under ultrasound for 5 minutes. Samples were washed and dried. Finally, ohmic contact between the metals Ni/Au and the p-type GaN layer was realized using the thermal annealing technique under conditions of $O_2$ and $N_2$ in a ratio of 1:4, a temperature of 500° C. and time of 10 minutes, as shown in FIG. 10.

(10) A top view of the resulting Micro-LED array device under an optical microscope was as shown in FIG. 14, an electrical test I-V characteristic curve was shown in FIG. 16, a planar structural schematic diagram was shown in FIG. 17, and a three-dimensional structural schematic diagram was shown in FIG. 18.

Embodiment 3

A method for fabricating a Micro-LED array device based on III-Nitride semiconductors with addition of blocking walls included the following steps.

The method was carried out on a Si blue LED epitaxial wafer that was structurally composed of:

the Si substrate 1 having a thickness of 800 µm;

the GaN buffer layer 2 grown on the Si substrate and having a thickness of 1750 nm;

the n-type GaN layer 3 grown on the buffer layer and having a thickness of 1850 nm;

the InGaN/GaN quantum-well active layer 4 grown on the n-type GaN layer; wherein the InGaN/GaN quantum-well active layer has a thickness of 300 nm, a period number of 10, an In content of 0.26, a Ga content of 0.74, a well width of 2.2 nm, and a barrier thickness of 5.8 nm; and the p-type GaN layer 5 grown on the quantum-well active layer and having a thickness of 200 nm.

(1) The first $SiO_2$ dielectric layer 6 having a thickness of 250 nm was deposited by evaporation on the Si blue LED epitaxial wafer using plasma enhanced chemical vapor deposition (PECVD) technique, as shown in FIG. 2, and a gas mixture of 5% $SiH_4/N_2$ and $N_2O$ was introduced for 11 minutes and 50 seconds, with respective flow rate of 100 sccm and 450 sccm, a pressure of 300 mTorr, a power of 10 W, and a temperature of 350° C.

(2) The insulating $SiO_2$ dielectric layer 6 was coated with the photoresist (S1805) layer 7 by spinning and then subjected to prebaking at 100° C. for 1 minute. Then, ordered sector mesa array patterns were formed on the photoresist using ultra-violet lithography with the mask as shown in FIG. 11, and exposed for 1 second, developed for 11 seconds and postbaked at 100° C. for 1 minute, as shown in FIG. 3.

(3) Using reactive ion etching (ME) technique, $O_2$ was introduced for 20 seconds with a flow rate of 10 sccm, a pressure of 3 Pa and a power of 50 W to remove residual photoresist, and a 50 nm thick layer of metal nickel (Ni) was deposited by evaporation as the metal mask layer 8 using physical vapor deposition (PVD) process at a rate of 1 A/s. Next, a lift-off process was carried out using an acetone solution under ultrasound for 5 minutes to remove the photoresist layer 7 and the metal Ni film layer 8 on the photoresist layer, to obtain ordered metal sector mesa array patterns with a large area, as shown in FIG. 4.

(4) Using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the first $SiO_2$ dielectric layer 6 was longitudinally etched with the metal Ni as a mask layer to transfer the metal sector mesa structures to the p-type GaN layer, as shown in FIG. 5.

(5) Using inductively coupled plasma (ICP) technique, a gas mixture of $Cl_2$ and $BCl_3$ was introduced for 3 minutes and 30 seconds, with respective flow rate of 48 sccm and 6 sccm, an ICP power of 300 W, an RF power of 100 W, and a pressure of 10 mTorr, and the p-type GaN layer 5 and the quantum-well layer 4 were anisotropically etched with the metal Ni as a mask to form sector mesa array structures deep into the n-type GaN layer 3, as shown in FIG. 6, with an etching depth of about 800 nm.

(6) Using wet etching, samples were firstly put in a KOH solution at a concentration of 0.5 mol/L, and heated in a water bath at 40° C. for 15 minutes to repair etching damage in sidewalls of GaN and quantum wells. Next, the samples were soaked in a nitric acid solution at a concentration of nitric acid:water=1:5 at room temperature for 10 minutes to remove the metal mask layer 8, and soaked in a buffered oxide etch (BOE) for 1 minute to remove the first $SiO_2$ dielectric layer 6, thereby forming GaN sector mesa array structures isolated from one another, as shown in FIG. 7.

(7) The second $SiO_2$ dielectric layer 9 having a thickness of 250 nm was deposited by evaporation using the PECVD technique, and a gas mixture of 5% $SiH_4/N_2$ and $N_2O$ was introduced for 11 minutes and 50 seconds, with respective flow rate of 100 sccm and 450 sccm, a pressure of 300 mTorr, a power of 10 W, and a temperature of 350° C. Next, spin coating was performed to obtain two layers of photoresist 10, the first layer of photoresist (LOR10B) was prebaked at 150° C. for 5 minutes, and the second layer of photoresist (AZ1500) was prebaked at 90° C. for 2 minutes. Then, blocking wall patterns and n-type electrode patterns were formed by overlaying on the photoresist using the ultra-violet lithography with the mask as shown in FIG. 12, with an exposure time of 4.3 seconds, developing time of 9 seconds and postbaking at 100° C. for 1 minute. Using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the second $SiO_2$ dielectric layer 9 was etched with the photoresist as a mask to transfer the blocking wall patterns and the n-type electrode patterns to the n-type GaN layer, as shown in FIG. 8.

(8) Fabrication of n-type electrodes: metals titanium (Ti)/aluminum (Al)/nickel (Ni)/gold (Au) were deposited by evaporation in the regions of the blocking walls and the regions of the n-type electrode patterns using the PVD technique with respective thickness of 40 nm/230 nm/60 nm/220 nm, a total thickness of 550 nm, as the n-type electrode 11, where the blocking wall was 10 μm wide and 550 nm thick. Then, a lift-off process was carried out using an acetone solution under ultrasound for 5 minutes to remove the photoresist layer 10 and the n-type electrode metal layer on the photoresist layer. Samples were washed and dried. Finally, ohmic contact between the metals Ti/Al/Ni/Au and the n-type GaN layer was realized using a thermal annealing technique under conditions of $N_2$, a temperature of 750° C. and time of 30 seconds, as shown in FIG. 9.

(9) Fabrication of p-type electrodes: spin coating was performed to obtain two new layers of photoresist, the first layer of photoresist (LOR10B) was prebaked at 150° C. for 5 minutes, and the second layer of photoresist (AZ1500) was prebaked at 90° C. for 2 minutes. Then, p-type electrode patterns were formed by overlaying on the photoresist using the ultra-violet lithography with the mask as shown in FIG. 13, with an exposure time of 4.3 seconds and a developing time of 9 seconds. Then, using the RIE technique, a gas mixture of $O_2$ and $CF_4$ was introduced for 3 minutes and 40 seconds, with respective flow rate of 10 sccm and 30 sccm, a power of 150 W, and a pressure of 4 Pa, and the second $SiO_2$ dielectric layer 9 was etched with the photoresist as a mask to transfer the p-type electrode patterns to the p-type GaN layer 5. Metals Ni/Au were deposited by evaporation using the PVD technique with respective thickness of 50 nm/150 nm, a total thickness of 200 nm, as the p-type electrode 12. Then, the photoresist layer and the metal Ni/Au film layer on the photoresist layer were removed using an acetone solution under ultrasound for 5 minutes. Samples were washed and dried. Finally, ohmic contact between the metals Ni/Au and the p-type GaN layer was realized using the thermal annealing technique under conditions of $O_2$ and $N_2$ in a ratio of 1:4, a temperature of 500° C. and time of 10 minutes, as shown in FIG. 10.

(10) A top view of the resulting Micro-LED array device under an optical microscope was as shown in FIG. 14, an electrical test I-V characteristic curve was shown in FIG. 16, a planar structural schematic diagram was shown in FIG. 17, and a three-dimensional structural schematic diagram was shown in FIG. 18.

The above embodiments are preferred embodiments of the present disclosure. However, the implementation modes of the present disclosure are not limited by the above embodiments. Any other change, modification, substitution, combination, and simplification made without departing from the spiritual essence and principles of the present disclosure shall be construed as equivalent replacements and fall within the protection scope of the present disclosure.

What is claimed is:

1. A micro-light emitting diode (Micro-LED) array device based on III-nitride semiconductors, structurally comprising from top to bottom in sequence:
a Si substrate;
a GaN buffer layer, wherein the GaN buffer layer is grown on the Si substrate;
an n-type GaN layer, wherein the n-type GaN layer is grown on the GaN buffer layer;
an InGaN/GaN quantum-well active layer, wherein the InGaN/GaN quantum-well active layer is grown on the n-type GaN layer; and
a p-type GaN layer, wherein the p-type GaN layer is grown on the InGaN/GaN quantum-well active layer,
wherein the Micro-LED array device has a plurality of arrayed sector mesa units,
wherein in each arrayed sector mesa unit of the plurality of arrayed sector mesa units, a sector mesa is formed by etching to penetrate through the p-type GaN layer and the InGaN/GaN quantum-well active layer and into the n-type GaN layer,
wherein the Micro-LED array device further comprises a p-type electrode array deposited by evaporation on the p-type GaN layer of the arrayed sector mesa units, and an n-type electrode array deposited by evaporation on the n-type GaN layer of the plurality of arrayed sector mesa units,
wherein n-type electrodes of the n-type electrode array in the each arrayed sector mesa unit surround the sector mesa of the each arrayed sector mesa unit in a form of an annular structure,
wherein the n-type electrodes of the n-type electrode array are blocking walls that are disposed between the sector mesas of the plurality of arrayed sector mesa units and isolate the sector mesas, of the plurality of arrayed sector mesa units, from one another, and
wherein the blocking walls are connected to each other, and each of the blocking walls and the annular structure surrounding the sector mesa of the each arrayed sector mesa unit are connected to each other, and wherein the blocking walls are at least partly disposed at a same height as, and extend above a top of, the InGaN/GaN quantum-well active layer of the sector mesas isolated by the blocking walls.

2. The Micro-LED array device according to claim 1, wherein the n-type electrode array is a Ti/Al/Ni/Au multi-layered metal structure.

3. The Micro-LED array device according to claim 2, wherein each of the blocking walls formed by the n-type electrodes is 6-10 μm wide and 450-550 nm thick.

4. The Micro-LED array device according to claim 1, wherein each of the blocking walls formed by the n-type electrodes is 6-10 μm wide and 450-550 nm thick.

5. The Micro-LED array device according to claim 4, wherein the Si substrate has a thickness of 800 μm; the GaN buffer layer has a thickness of 1750 nm; the n-type GaN layer has a thickness of 1650-1850 nm; the InGaN/GaN quantum-well active layer has a thickness of 200-300 nm, a period number of 10, an In content of 0.26, a Ga content of 0.74, a well width of 2.2 nm, and a barrier thickness of 5.8 nm; and the p-type GaN layer has a thickness of 100-200 nm.

6. The Micro-LED array device according to claim 4, wherein the sector mesas in the each arrayed sector mesa unit come in three sizes: from the inside out, a first mesa defined by one quarter of a circular ring with a radius of 32 μm; a second mesa defined by one eighth of a circular ring and one quarter of a circular ring inside with a difference of 50 μm between inside and outside radii; and a third mesa defined by one eighth of a circular ring and one eighth of a circular ring inside with a difference of 100 μm between inside and outside radii; the sector mesas in three sizes are concentric; and a period between an outermost circular ring sector and a next circular ring sector in the same size is 900 µm.

7. The Micro-LED array device according to claim 4, wherein the sector mesas in the each arrayed sector mesa unit come in three sizes, and the sector mesas in three sizes are concentric.

8. A method for fabricating the Micro-LED array device according to claim 1, comprising the following steps:
   (1) depositing a first insulating layer as a first dielectric layer on an InGaN/GaN quantum-well LED epitaxial wafer using a plasma enhanced chemical vapor deposition (PECVD) technique;
   (2) coating the first dielectric layer with photoresist by spinning, prebaking the photoresist, using an ultra-violet lithography with a first mask to form first ordered sector mesa array patterns on the photoresist, and carrying out a developing and a postbaking;
   (3) using a reactive ion etching (RIE) technique, introducing $O_2$ to remove a small amount of residual photoresist in regions, wherein most of the photoresist is removed by the developing in the regions;
   (4) depositing by evaporation a metal mask layer using a physical vapor deposition (PVD) technique, and removing a photoresist layer and a metal film layer on the photoresist layer using a lift-off technique, to obtain second ordered sector mesa array patterns with a large area;
   (5) using the RIE technique, longitudinally etching the first dielectric layer with a first metal as a second mask to transfer sector mesa array structures to the p-type GaN layer;
   (6) using an inductively coupled plasma (ICP) technique, anisotropically etching the p-type GaN layer and the InGaN/GaN quantum-well active layer to the n-type GaN layer with a second metal as a third mask;
   (7) using a wet etching, removing the metal mask layer and the first dielectric layer on the sector mesa array structures, to form GaN sector mesa array structures isolated from one another, and repair etching damages in sidewalls of the p-type GaN layer and the InGaN/GaN quantum-well active layer;
   (8) fabricating the n-type electrode array that isolates the sector mesas from one another: firstly depositing by evaporation a second insulating layer as a second dielectric layer on the GaN sector mesa array structures using the PECVD technique, and coating the second dielectric layer with the photoresist by spinning; forming n-type electrode array structure patterns by overlaying on the photoresist of the GaN sector mesa array structures using the ultra-violet lithography with a fourth mask having the n-type electrode array, and etching the second dielectric layer using the RIE technique with the photoresist as a fifth mask to transfer the n-type electrode array structure patterns to the n-type GaN layer;
   (9) fabricating the n-type electrodes: depositing by evaporation a third metal in regions of the n-type electrode array structure patterns as the n-type electrodes using the PVD technique, then carrying out a lift-off process to remove the photoresist layer and the metal film covering the photoresist layer to obtain n-type electrodes, washing and drying the processed n-type electrodes, and finally realizing a first ohmic contact between the third metal and the n-type GaN layer using a thermal annealing technique; and
   (10) fabricating p-type electrodes: carrying out a spin coating to obtain a new layer of the photoresist, forming p-type electrode array patterns by overlaying on the photoresist using the ultra-violet lithography with a sixth mask, and etching the second dielectric layer using the RIE technique with the photoresist as a seventh mask to transfer the p-type electrode array patterns to the p-type GaN layer; depositing by evaporation a layer of a fourth metal as the p-type electrode array using the PVD technique, then carrying out the lift-off process to remove the photoresist layer and the metal film covering the photoresist layer to obtain processed p-type electrode array, washing and drying the processed p-type electrode array, and finally realizing a second ohmic contact between the fourth metal and the p-type GaN layer using the thermal annealing technique.

9. The method according to claim 8, wherein the first dielectric layer and the second dielectric layer are 150-250 nm thick and made of $SiO_2$, and the metal mask layer is 50 nm thick and made of Ni.

10. The method according to claim 8, wherein the n-type electrode array is composed of a plurality of layers of metals Ti/Al/Ni/Au, and the n-type electrode array has a thickness of 450-550 nm, and the p-type electrode array is composed of a plurality of layers of metals Ni/Au, and the p-type electrode array has a thickness of 150-200 nm.

11. The method according to 8, wherein the n-type electrode array is a Ti/Al/Ni/Au multi-layered metal structure.

12. The method according to 8, wherein each of the blocking walls formed by the n-type electrodes is 6-10 µm wide and 450-550 nm thick.

13. The method according to claim 12, wherein the Si substrate has a thickness of 800 µm; the GaN buffer layer has a thickness of 1750 nm; the n-type GaN layer has a thickness of 1650-1850 nm; the InGaN/GaN quantum-well active layer has a thickness of 200-300 nm, a period number of 10, an In content of 0.26, a Ga content of 0.74, a well width of 2.2 nm, and a barrier thickness of 5.8 nm; and the p-type GaN layer has a thickness of 100-200 nm.

14. The method according to claim 12, wherein the sector mesas in the each arrayed sector mesa unit comes in three sizes: from the inside out, a first mesa defined by one quarter of a circular ring with a radius of 32 µm; a second mesa defined by one eighth of a circular ring and one quarter of a circular ring inside with a difference of 50 µm between inside and outside radii; and a third mesa defined by one eighth of a circular ring and one eighth of a circular ring inside with a difference of 100 µm between inside and outside radii; the sector mesas in three sizes are concentric; and a period between an outermost circular ring sector and a next circular ring sector in the same size is 900 µm.

* * * * *